United States Patent [19]

Ushiki

[11] Patent Number: 5,397,213
[45] Date of Patent: Mar. 14, 1995

[54] CONVEYING DEVICES USED IN A SEMICONDUCTOR ASSEMBLY LINE

[75] Inventor: Hiroshi Ushiki, Saitama, Japan

[73] Assignee: Kabushiki Kaisha Shinkawa, Tokyo, Japan

[21] Appl. No.: 236,663

[22] Filed: Apr. 29, 1994

Related U.S. Application Data

[63] Continuation of Ser. No. 56,575, Apr. 28, 1993, abandoned, which is a continuation of Ser. No. 697,237, May 6, 1991, abandoned.

[30] Foreign Application Priority Data

May 7, 1990 [JP] Japan .................................. 2-115906

[51] Int. Cl.⁶ ............................................. B65G 57/00
[52] U.S. Cl. ............................ 414/788.4; 414/788.7; 414/900; 414/938
[58] Field of Search .................. 414/788.7, 900, 937, 414/938, 940; 248/149, 172

[56] References Cited

U.S. PATENT DOCUMENTS

| | | | |
|---|---|---|---|
| 3,488,693 | 1/1970 | Brinkmeier | 414/900 X |
| 3,513,990 | 5/1970 | Wolle | 414/788.7 |
| 3,584,847 | 6/1971 | Hammond, Jr. et al. | 414/937 X |
| 4,234,281 | 11/1980 | Lanham et al. | 414/900 X |
| 4,355,938 | 10/1982 | Page | 414/900 X |
| 4,674,238 | 6/1987 | Suzuki et al. | 414/788.7 |

*Primary Examiner*—Frank E. Werner
*Assistant Examiner*—Janice L. Krizek
*Attorney, Agent, or Firm*—Koda and Androlia

[57] ABSTRACT

A conveyor system used in semiconductor manufacturing line, etc. including guide rails which guide workpieces in one direction and a pair of magazine stackers for workpieces installed at both ends of the workpiece guide rails and has magazine guide rails, in which the workpiece guide rails and magazine guide rails are movable in a direction perpendicular to a workpiece feed direction and are connected via a connecting assembly so that the workpiece guide rails and magazine guide rails are moved together.

2 Claims, 4 Drawing Sheets

FIG. I

CONVEYING DEVICES USED IN A SEMICONDUCTOR ASSEMBLY LINE

This application is a continuation of application Ser. No. 08/056,575, filed Apr. 28, 1993, abandoned, which is a continuation of application Ser. No. 07/697,237, filed May 6, 1991, abandoned.

BACKGROUND OF THE INVENTION

1. Field of the Invention

The present invention relates to a conveying device used in semiconductor assembling/manufacturing apparatuses such as wire bonders, die bonders, etc.

2. Prior Art

Conventional conveying systems used, for example, in bonders are constructed as shown in FIGS. 6 through 8. A workpiece feeder base 61 is provided on a base 60, and stands 62 are installed on this workpiece feeder base 61. Two workpiece guide rails 63A and 63B are provided on the stands 62 to face each other.

As shown in FIG. 6, a loader-side magazine stacker 70 and an unloader-side magazine stacker 71 are respectively provided at the left and right side ends of the workpiece guide rails 63A and 63B. Since the two stackers 70 and 71 have more or less the same structure and are constructed with left-right symmetry, the same symbols are used to designate the same or corresponding parts for the two stackers, and only the loader-side magazine stacker 70 will be described in detail.

The loader-side magazine stacker 70 has an elevator mechanism 74 which drives elevator 73, and the elevator 73 moves up and down the magazine 72. Attachment frames 75 and 76 are installed to face each other on the elevator mechanism 74. Magazine guide rails 77A and 77B as well as the magazine guide rails 78A and 78B are mounted to the attachment frames 75 and 76 and guide the four corners of the magazine 72 in the vertical direction.

Before the apparatus is started, the magazine 72 with stacked workpieces therein is set in the loader-side magazine stacker 70, and an empty magazine 72 is set in the unloader-side magazine stacker 71.

Workpieces are fed out onto the workpiece guide rails 63A and 63B from the magazine 72 of the loader-side magazine stacker 70 by a pusher (not shown). When a workpiece is fed out of the magazine 72, the magazine 72 is raised or lowered by one pitch so that the next workpiece in the magazine 72 is fed out. The workpieces fed out onto the workpiece guide rails 63A and 63B are intermittently fed by a feeder mechanism (not shown) and then bonding is performed by a bonding apparatus (not shown) which is installed beside the workpiece guide rails 63A and 63B. When the bonding has thus been completed, the workpieces are accommodated in the magazine 72 set in the unloader-side magazine stacker 71. When a workpiece is accommodated in this magazine 72, the elevator 73 of the unloader-side magazine stacker 71 is raised or lowered by one pitch by the elevator mechanism 74 of the magazine stacker 71 so that the next workpiece is brought into the magazine 72.

In the above conveying system, the space between the workpiece guide rails 63A and 63B and the space between the magazine guide rails 77A and 77B as well as the magazine guide rails 78A and 78B needs to be changed when different size (or width) workpieces are processed (depending upon the type of product).

Conventionally, such a size-matching (size-matching) of the guide rails is accomplished in the following manner: as seen in FIGS. 6 and 8, positioning pins 80 are mounted to the stands 62, and gauge plates 81 are on the positioning pins 80. The space between the workpiece guide rails 63A and 63B is determined via these gauge plates 81. The size-matching (width-matching) of the magazine guide rails 77A and 77B and rails 78A and 78B is also determined by gauge plates 83.

However, in this method, the workpiece guide rails and the magazine guide rails must be adjusted individually, which is extremely inefficient.

As a means to solve this problem, the Japanese Patent Application Laid-Open ("Kokai") No. 60-67312 discloses screws to be turned by motor so that workpiece guide rails are moved in the direction of width of the workpieces via the screws.

In this prior art, an adjustment of the workpiece guide rails is relatively easy. However, since as shown in FIG. 6, the magazine guide rails 77A and 77B as well as 78A and 78B must be adjusted using the gauge plates 83, the time for such an adjustment operation is increased. Also, since the adjustment work is performed by a worker, it is likely that the amount of play between the magazines 72 and the magazine guide rails 77A and 77B as well as 78A and 78B is inconsistent.

SUMMARY OF THE INVENTION

Accordingly, the object of the present invention is to provide a conveying device in which the time required for product change-over (or size-adjustment) is greatly reduced, and in which the amount of play between the magazines and the magazine guide rails become constant, thus, eliminating positional differences among them.

In order to achieve the object, in the present invention, the workpiece guide rails and magazine guide rails are installed so as to be movable in the direction perpendicular to the workpiece feed direction, and the workpiece guide rails and the magazine guide rails are connected by connecting means so that all the rails are moved together.

Thus, when the workpiece guide rails are moved in the direction perpendicular to the workpiece feed direction so that the spaces between the guide rails match the width of the workpiece, the magazine guide rails are also moved together with the workpiece guide rails via the connecting means. Thus, the magazine guide rails are always matched to the width of the magazines.

DETAILED DESCRIPTION OF THE INVENTION

One embodiment of the present invention will be described with reference to the accompanying drawings.

Figure 3:
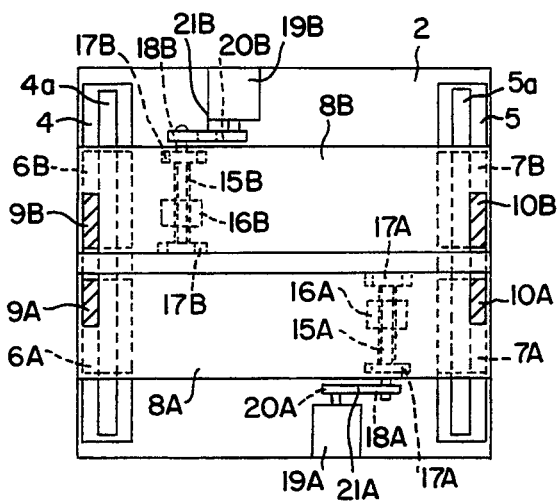
FIG. 3 is a cross section taken along the line 3—3 in FIG. 2.

A workpiece feeder base 2 is installed on a base 1, and two stands 4 and 5 which have guides 4a and 5a are provided parallel to each other on the workpiece feeder base 2. The guides 4a and 5a are installed in the direction perpendicular to the workpiece feed direction which is indicated by arrow 3. As seen in FIG. 3, two linear guides 6A and 6B as well as 7A and 7B are installed so that they slide on the stands 4 and 5, and moving bases 8A and 8B are respectively provided on the linear guides 6A and 6B and linear guides 7A and 7B. Workpiece guide rails 11A and 11B are installed to face each other on the moving bases 8A and 8B via stands 9A and 10A and stands 9B and 10B.

Screws 15A and 15B are provided parallel to the guides 4a and 5a of the stands 4 and 5 underneath the moving bases 8A and 8B. Nuts 16A and 16B which are fastened to the undersurfaces of the moving bases 8A and 8B engage with the screws 15A and 15B. Both ends of the screws 15A and 15B are supported by respective bearings 17A and 17B so that the screws 15A and 15B are free to rotate. Pulleys 18A and 18B are respectively provided at one end of each of the screws 15A and 15B. Motors 19A and 19B are mounted to the surface of the workpiece feeder base 2, and timing belts 21A and 21B are provided on the output shafts of the motors 19A and 19B.

A loader-side magazine stacker 30 and an unloader-side magazine stacker 31 are installed at the left and right ends of the workpiece guide rails 11A and 11B. The loader-side magazine stacker 30 and the unloader-side magazine stacker 31 have the same structure and are constructed with left-right symmetry. Accordingly, the same symbols are used to designate the same or corresponding parts, and only the loader-side magazine stacker 30 will be described below.

Figure 4:
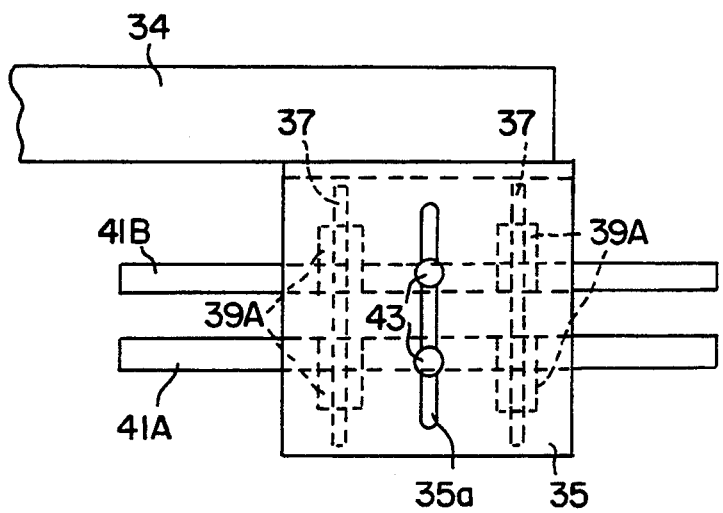
FIG. 4 is a left-side view of the loader-side magazine stacker.

The loader-side magazine stacker 30 has an elevator mechanism 34 which drives an elevator 33 that moves a magazine 32 upwardly and downwardly. Attachment frames 35 and 36 are fastened to the elevator mechanism 34 so that they face each other. Guides 37 and 38 which extend in the direction perpendicular to the workpiece feed direction 3 are respectively provided on the upper and lower portions of the attachment frames 35 and 36. Linear guides 39A and 39B as well as 40A and 40B are respectively installed on the guides 37 and 38 so that the linear guides are free to slide. Magazine guide rails 41A and 41B and also 42A and 42B which guide the four corners of the magazine 32 in the vertical direction are respectively mounted to the linear guides 39A and 39B and also 40A and 40B. Furthermore, as best seen in FIG. 4, a horizontal slot 35a which is parallel to the guide 37 is formed in the attachment frame 35, and the magazine guide rails 41A and 41B are fastened to the attachment frame 35 by fastening screws 43 via the slot 35a.

The respective ends of the workpiece guide rails 11A and 11B are connected by connecting means 50A and 50B to the magazine guide rails 41A and 42A and to the rails 41B and 42B of the loader-side magazine stacker 30 and unloader-side magazine stacker 31, respectively. Since the connecting means 50A and 50B are constructed in the same manner, only the connecting means 50A will be described.

Figure 1:
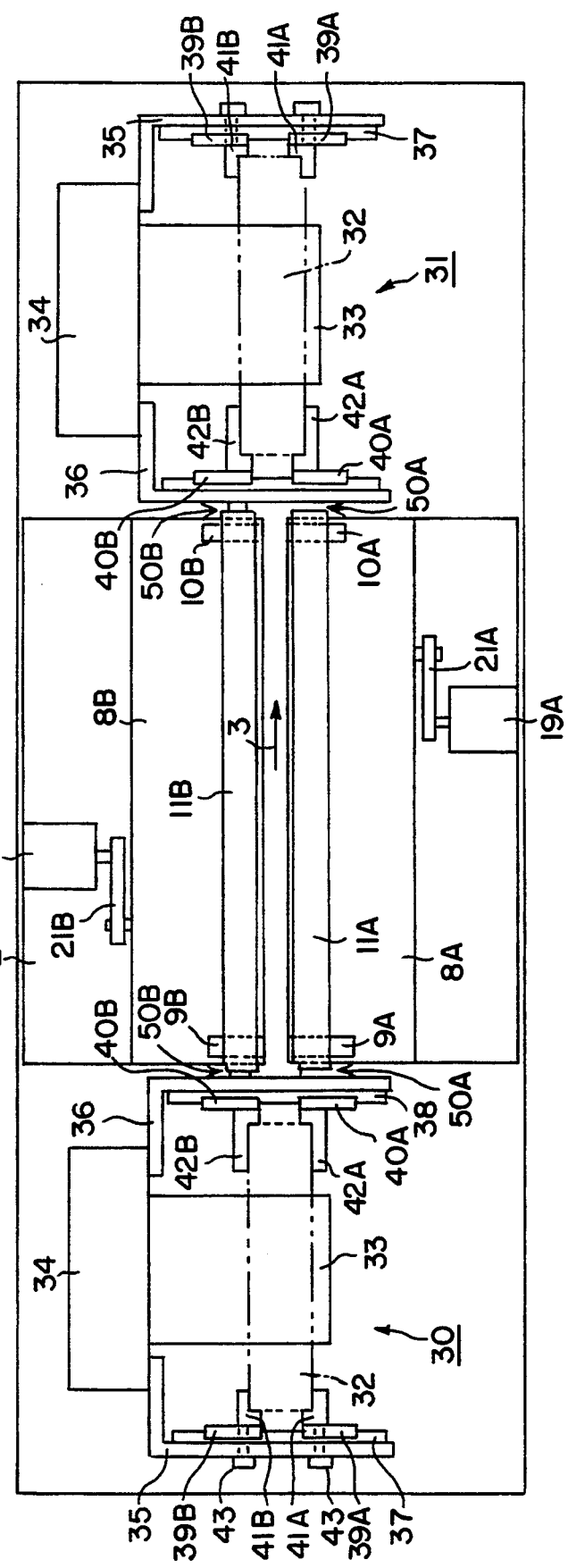
FIG. 1 is a top view showing one embodiment of the conveying device of the present invention.
Figure 2:
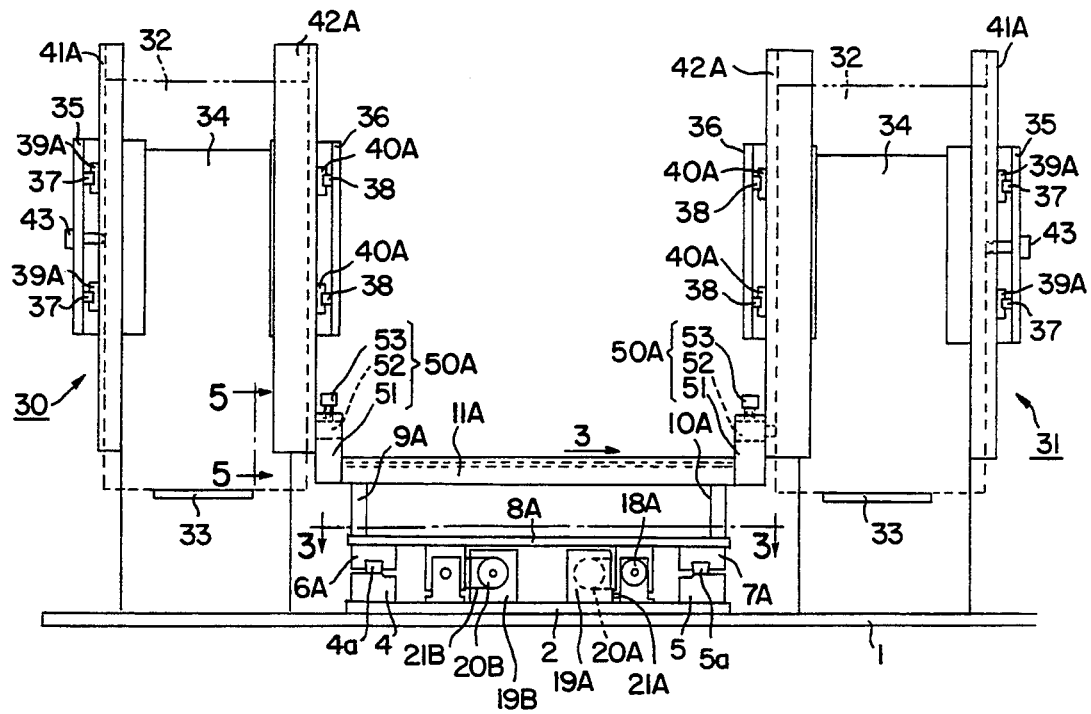
FIG. 2 is a front view thereof.
Figure 5:
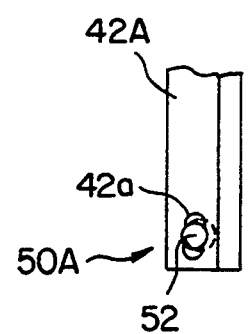
FIG. 5 is a view taken along the line 5—5 in FIG. 2.
Figure 8:
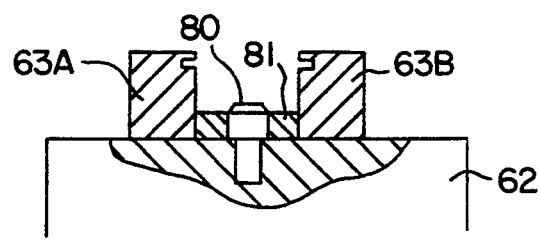
FIG. 8 is a cross section taken along the line 8—8 in FIG. 7.
Figure 6:
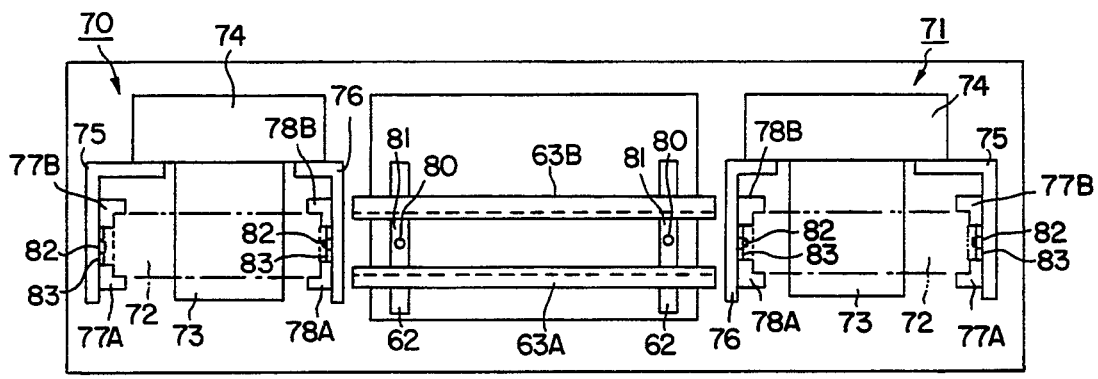
FIG. 6 is a top view of a conventional conveyor system.
Figure 7:
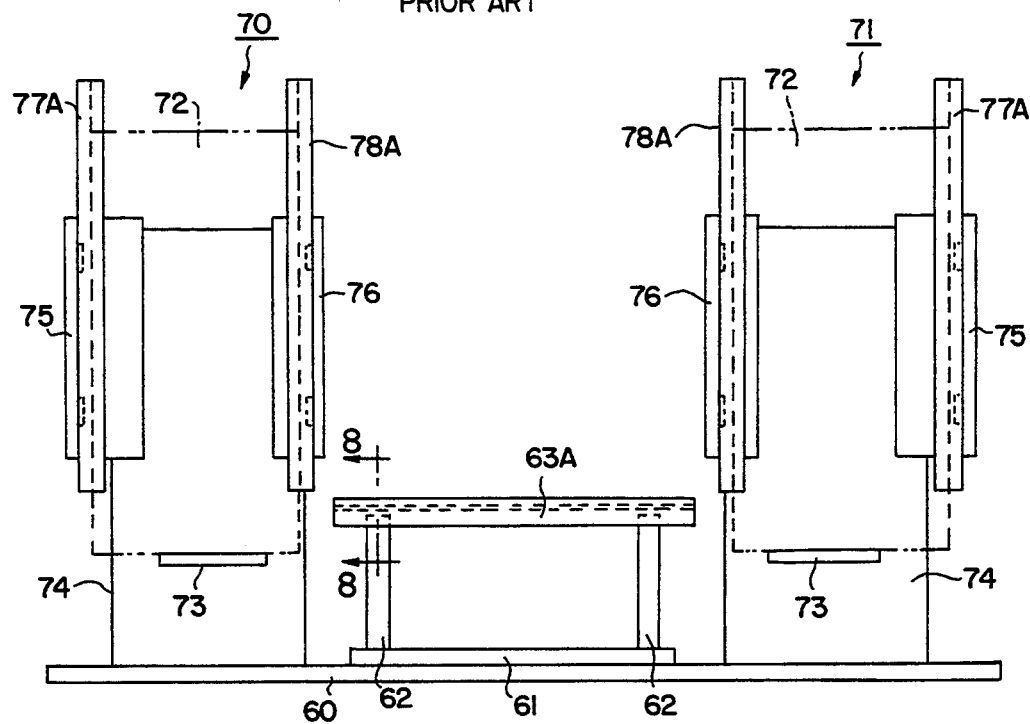
FIG. 7 is a front view thereof.

As seen in FIG. 2, joints 51 are fastened to both ends of the workpiece guide rail 11A. Eccentric pins 52 which extend toward the magazine guide rails 42A are inserted in the joints 51, and these eccentric pins 52 are fastened to the joints 51 by screws 53. As shown in FIG. 5, vertical slots 42a into which the tip of the eccentric pin 52 is inserted is formed in each of the magazine guide rails 42A. Each slot 42a is formed so that its horizontal width approximately coincides with the diameter of the tip portion of the eccentric pin 52.

The above conveying device operates in the following manner:

First, an adjustment in the relative positional relationship is made between the workpiece guide rail 11A and the magazine guide rails 41A and 42A and also between the workpiece guide rail 11B and the magazine guide rails 41B and 42B. The connecting means 50A and 50B are used for such an adjustment. More specifically, when the screws 53 are loosened and the eccentric pins 52 are turned, the magazine guide rails 42A or 42B are moved in the direction perpendicular to the workpiece feed direction 3 guided by the linear guides 40A or 40B. Thus, the relative positional relationship between the workpiece guide rail 11A and the magazine guide rails 41A and 42A, and the relative positional relationship between the workpiece guide rail 11B and the magazine guide rails 41B and 42B are adjusted.

If workpieces of different size (in width) are processed, the motors 19A and 19B are first rotated by amounts which are programmed beforehand in a control device (not shown) of the motors 19A and 19B according to the size of the product processed. The rotation of the motors 19A and 19B is transmitted to the screws 15A and 15B via the pulleys 20A and 20B, timing belts 21A and 21B and pulleys 18A and 18B. As a result, the nuts 16A and 16B are caused to move in the direction perpendicular to the workpiece feed direction 3. Since the moving bases 8A and 8B are respectively fastened to the nuts 16A and 16B, the moving bases 8A and 8B are moved along the guides 4a and 5a of the stands 4 and 5. Since the workpiece guide rails 11A and 11B are fastened to the moving bases 8A and 8B via the stands 9A and 10A as well as 9B and 10B, the workpiece guide rails 11A and 11B are respectively moved in the direction perpendicular to the workpiece feed direction 3. As a result, the space between the workpiece guide rails 11A and 11B is adjusted (that is, increased or reduced) so that the space between the rails 11A and 11B matches the width of the workpieces to be processed.

Since the ends of the workpiece guide rails 11A and 11B are connected to the magazine guide rails 42A and 42B by the connecting means 50A and 50B, the magazine guide rails 42A and 42B are also moved when the workpiece guide rails 11A and 11B are moved as described above. The movement of the workpiece guide rails 11A and 11B is transmitted to the magazine guide rails 42A and 42B via the joints 51 and eccentric pins 52.

The magazine guide rails 42A and 42B located near the workpiece guide rails 11A and 11B (or on the workpiece guide rail side) are adjusted in the above-described manner.

The magazine guide rails 41A and 41B, which are on the further side of workpiece guide rails 11A and 11B, are adjusted in the following manner: The fastening screws 43 are loosened, and the space between the magazine guide rails 41A and 41B is widened. Then, a magazine 32 is set between the magazine guide rails 42A and 42B (which have been set as described above) and placed on the elevator 33. Using this magazine 32 as a gauge, the magazine guide rails 41A and 41B are brought so as to come into contact with the magazine 32. Then, the fastening screws 43 are tightened so as to fix the guide rails 41A and 41B in place.

Thus, the space between the magazine guide rails 42A and 42B located adjacent to the workpiece guide rails 11A and 11B is automatically adjusted when the space between the workpiece guide rails 11A and 11B is adjusted, while the magazine guide rails 41A and 41B are adjusted by the magazines 32. Accordingly, product change-over work is accomplished easily, and the time required for such a work is greatly reduced. Since the amount of play between the magazines 32 and the magazine guide rails 41A and 41B and also 42A and 42B is constant, there is little discrepancy between them.

In the embodiment described above, the workpiece guide rails 11A and 11B are both moved for adjustment. However, it goes without saying that the same result is obtained by designing that only one of the workpiece guide rails (11A or 11B) is moved with the other workpiece guide rail being fixed in place. In this case, there would be no need for a drive mechanism or connecting means for the fixed workpiece guide rail and corresponding magazine guide rails. In the embodiment, a loader-side magazine stacker 30 and an unloader-side magazine stacker 31 were installed at the ends of the workpiece guide rails 11A and 11B. However, it would be possible to apply the present invention to a configuration which has only a loader-side magazine stacker 30, or only an unloader-side magazine stacker 31.

As described in detail in the above, in the present invention, workpiece guide rails and magazine guide rails are installed so that they are movable in the direction perpendicular to the workpiece feed direction. The workpiece guide rails and the magazine guide rails (which are adjacent to the workpiece guide rails) are connected by connecting means so that the rails are all moved together. Accordingly, the time required for product change-over is greatly reduced. In addition, the amount of play between the magazines and the magazine guide rails is constant, thus eliminating positional discrepancy among them.

I claim:

1. A conveying device for a semiconductor assembly line comprising: a pair of parallel workpiece guide rails which guide semiconductor workpieces in one direction from a loader side to an unloader side of said workpiece guide rails, a loader-side magazine stacker installed at one end of said pair of parallel workpiece guide rails and an unloader-side magazine stacker installed at another end of said workpiece guide rails, a pair of magazine guide rails adjacent each end of said pair of workpiece guide rails, said magazine guide rails guiding magazines, a loader side magazine adjacent said loader side magazine stacker for storing said semiconductor workpieces, said loader side magazine stacker feeding semiconductor workpieces from said loader side magazine, an unloader side magazine adjacent said unloader-side magazine stacker for receiving and storing said semiconductor workpieces, connecting means located between said pair of workpiece guide rails and said pair of magazine guide rails at each end of said pair of workpiece guide rails for causing said pair of workpiece guide rails and said pair of magazine guide rails to move together simultaneously in a direction perpendicular to a workpiece feed direction such that a distance between said pair of workpiece guide rails and a distance between said pair of magazine guide rails is maintained to be substantially the same and substantially equal to a width of said semiconductor workpiece guided on said workpiece guide rails.

2. A conveying device according to claim 1, wherein there are two pairs of magazine guide rails.

* * * * *